(12) United States Patent
Maung et al.

(10) Patent No.: US 11,003,605 B2
(45) Date of Patent: May 11, 2021

(54) INPUT/OUTPUT (I/O) LEVEL SHIFTER FOR HALF DUPLEX SIM CARD INTERFACE

(71) Applicant: Texas Instruments Incorporated, Dallas, TX (US)

(72) Inventors: Win Naing Maung, Plano, TX (US); Charles Michael Campbell, Wylie, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/684,711

(22) Filed: Nov. 15, 2019

(65) Prior Publication Data

US 2020/0201795 A1    Jun. 25, 2020

Related U.S. Application Data

(60) Provisional application No. 62/781,868, filed on Dec. 19, 2018.

(51) Int. Cl.
*G06F 13/20* (2006.01)
*H04L 5/16* (2006.01)
*H03K 19/0175* (2006.01)

(52) U.S. Cl.
CPC ..... *G06F 13/20* (2013.01); *H03K 19/017509* (2013.01); *H04L 5/16* (2013.01)

(58) Field of Classification Search
CPC .... G06F 13/20; H04L 5/16; H03K 19/017509
See application file for complete search history.

(56) References Cited

U.S. PATENT DOCUMENTS

| | | | | |
|---|---|---|---|---|
| 5,424,657 A | * | 6/1995 | Van Brunt | H04L 5/16 326/63 |
| 8,970,260 B1 | * | 3/2015 | de Haas | H03K 19/017509 327/108 |
| 2011/0195749 A1 | * | 8/2011 | Lan | H04W 8/183 455/558 |
| 2012/0115546 A1 | * | 5/2012 | Lin | G06K 19/0701 455/558 |
| 2013/0176066 A1 | * | 7/2013 | Yamaguchi | H03K 3/356104 327/333 |

* cited by examiner

*Primary Examiner* — Glenn A. Auve
(74) *Attorney, Agent, or Firm* — John R. Pessetto; Charles A. Brill; Frank D. Cimino

(57) ABSTRACT

An input/output (I/O) level shifter for a subscriber identification module (SIM) interface includes a controller configured to apply a first enable signal to turn ON a first transmitter when the direction of packet flow is from an interface device to a SIM card, and is configured to apply a second enable signal to turn ON a second transmitter when the direction of packet flow is from the SIM card to the interface device. The controller is configured to not apply the first and the second enable signals concurrently. The controller selectively controls the ON/OFF period of the first and the second transmitter to maintain half-duplex communication on the interface I/O line and the SIM I/O line to prevent undesired positive data feedback.

35 Claims, 2 Drawing Sheets

INPUT/OUTPUT (I/O) LEVEL SHIFTER FOR HALF DUPLEX SIM CARD INTERFACE

CROSS REFERENCE TO RELATED APPLICATIONS

This application claims priority from U.S. Provisional Application No. 62/781,868, filed Dec. 19, 2018, entitled "BIDIRECTIONAL AUTONOMOUS LEVEL SHIFTER FOR HALF DUPLEX SIM CARD INTERFACE", assigned to the present assignee and incorporated herein by reference.

BACKGROUND

The disclosure relates to an input/output (I/O) level shifter for a half duplex subscriber identification module (SIM) card interface.

DESCRIPTION OF THE RELATED ART

A SIM card is an integrated circuit (IC) that securely stores an international mobile subscriber identity (IMSI) number and its related key, which are used to identify and authenticate subscribers on mobile devices such as mobile phones and computers. SIM cards also store other information including contact information and financial information.

Due to advances in semiconductor process technology, ICs have decreased in size and operate at lower voltages. For example, processors and SoCs can operate at 1.0V or 1.2V. SIM cards, however, operate at higher voltages, e.g., 1.8V or 3.3V. Thus, when a mobile device is connected to a SIM card, I/O signals exchanged between the mobile device and the SIM card are level-shifted so that signals transmitted by the mobile device are level-shifted up from 1.0V or 1.2V to 1.8V or 3.3V, and signals transmitted by the SIM card are level-shifted down from 1.8V or 3.3V to 1.0V or 1.2V. Since I/O signals are transmitted between the mobile device and the SIM card over the same I/O line, transmitters and receivers must be operated to maintain a half-duplex communication on the I/O line to prevent undesired positive data feedback.

Existing interface circuits which are currently used to level-shift I/O signals generally include decoders to decode packets received from a transmitting device (e.g., mobile device or SIM card) in order to detect the data rate of the transmitting device. The existing interface circuits also include level shifters to level-shift the decoded packets to an appropriate voltage level compatible with a destination device (e.g., mobile device or SIM card), and include encoders to encode the level-shifted packets prior to transmission to the destination device. Existing interface circuits are complex, require significant space in ICs, and cause packet latencies.

SUMMARY

Various aspects of the present disclosure are directed to an input/output (I/O) level shifter for a subscriber identification module (SIM) interface. In one aspect, the I/O level shifter includes a first receiver having a data input coupled to an interface input/output (I/O) line and having a data output. The I/O level shifter further includes a first transmitter having a data input, a control input and, a data output coupled to a SIM input/output (I/O) line. The I/O level shifter also includes a first delay element coupled between the first receiver and the first transmitter. The first delay element has a data input coupled to the data output of the first receiver and has a data output coupled to the data input of the first transmitter. The I/O level shifter also includes a second receiver having a data input coupled to a SIM I/O line and having a data output. The I/O level shifter also includes a second transmitter having a data input, a control input, and a data output coupled to the interface I/O line. The I/O level shifter also includes a second delay element coupled between the second receiver and the second transmitter. The second delay element has a data input coupled to the data output of the second receiver and has a data output coupled to the data input of the second transmitter. The I/O level shifter also includes a controller having a first input coupled to the data output of the first receiver and having a second input coupled to the data output of the second receiver. The controller is configured to apply a first enable signal to the control input of the first transmitter to turn ON the first transmitter when the direction of packet flow is from an interface device to a SIM card. The controller is configured to apply a second enable signal to the control input of the second transmitter to turn ON the second transmitter when the direction of packet flow is from the SIM card to the interface device. The controller is configured to not apply the first and the second enable signals concurrently.

In an additional aspect of the disclosure, the direction of packet flow is from the interface device to the SIM card when a HIGH to LOW transition of the interface I/O line occurs prior to a HIGH to LOW transition of the SIM I/O line, and the direction of packet flow is from the SIM card to the interface device when a HIGH to LOW transition of the SIM I/O line occurs prior to a HIGH to LOW transition of the interface I/O line.

In an additional aspect of the disclosure, the controller is configured to apply a first disable signal to the control input of the first transmitter responsive to a LOW to HIGH transition of the interface I/O line. The controller is configured to apply a second disable signal to the control input of the second transmitter responsive to a LOW to HIGH transition of the SIM I/O line. The controller is configured to apply the first and second disable signals concurrently when the peripheral I/O line and the SIM I/O line are both idle.

In an additional aspect of the disclosure, the first receiver is coupled to a first voltage supply and the first transmitter is coupled to a second voltage supply. The second receiver is coupled to a second voltage supply and the second transmitter is coupled to a first voltage supply.

In an additional aspect of the disclosure, the I/O level shifter is configured to convert an interface I/O signal from the interface I/O line having a first voltage level to a SIM I/O signal having a second voltage level. The I/O level shifter is configured to convert a SIM I/O signal from the SIM I/O line having a second voltage level to an interface I/O signal having a first voltage level.

In an additional aspect of the disclosure, an I/O level shifter for a subscriber identification module (SIM) interface includes a first receiver having a data input coupled to an interface input/output (I/O) line and having a data output. The I/O level shifter further includes a first transmitter having a data input, a control input, and a data output coupled to a SIM input/output (I/O) line. The I/O level shifter also includes a first delay element coupled between the first receiver and the first transmitter. The first delay element has a data input coupled to the data output of the first receiver and has a data output coupled to the data input of the first transmitter. The I/O level shifter also includes a second receiver having a data input coupled to the SIM I/O line and having a data output. The I/O level shifter also includes a second transmitter having a data input, a control input, and a data output coupled to the interface I/O line. The I/O level shifter also includes a second delay element coupled between the second receiver and the second transmitter. The second delay element has a data input coupled to the data output of the second receiver and has a data output coupled to the data input of the second transmitter. The I/O level shifter also includes a controller having a first input coupled to the data output of the first receiver and having a second input coupled to the data output of the second receiver. The controller is configured to apply a first enable signal to the control input of the first transmitter to turn ON the first transmitter when a HIGH to LOW transition of the interface I/O line occurs prior to a HIGH to LOW transition of the SIM I/O line. The controller is configured to apply a second enable signal to the control input of the second transmitter when a HIGH to LOW transition of the SIM I/O line occurs prior to a HIGH to LOW transition of the interface I/O line. The controller is configured to not apply both the first and second enable signals concurrently. The controller is configured to apply a first disable signal to the control input of the first transmitter to turn OFF the first transmitter responsive to a LOW to HIGH transition of the interface I/O line. The controller is configured to apply a second disable signal to the control input of the second transmitter to turn OFF the second transmitter responsive to a LOW to HIGH transition of the SIM I/O line.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein. Rather, these descriptions are provided so that this disclosure will satisfy applicable requirements.

Figure 1:
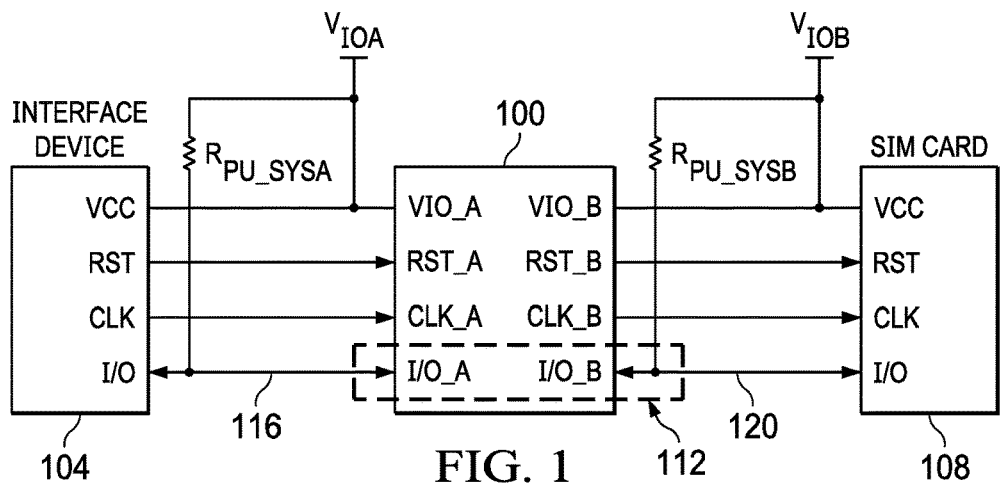
FIG. 1 illustrates a subscriber identification module (SIM) interface in accordance with an exemplary embodiment.

FIG. 1 shows a subscriber identification module (SIM) interface 100 which is used by an interface device 104 to read a SIM card 108 in accordance with an exemplary embodiment. The interface device 104 may, for example, be a mobile phone, a USB device or any other device adapted to read the SIM card 108. The SIM interface 100 includes a bidirectional input/output (I/O) level shifter 112 (shown by a dashed rectangle) which allows data exchange between the interface device 104 and the SIM card 108 and level-shifts I/O signals exchanged between the interface device 104 and the SIM card 108.

With reference to FIG. 1, the SIM interface 100 has a first set of terminals adapted for connection to corresponding terminals of the interface device 104 and also has a second set of terminals adapted for connection to corresponding terminals of the SIM card 108. The SIM interface 100 has voltage supply terminals VIO_A and VIO_B. The SIM interface 100 has a reset terminal RST_A coupled to receive a reset signal from the interface device 104 and has a reset terminal RST_B coupled to transfer the reset signal to the SIM card 108. The SIM interface 100 has an incoming clock terminal CLK_A coupled to receive a clock signal from the interface device 104 and has an outgoing clock terminal CLK_B coupled to transfer the clock signal to the SIM card 108.

With continuing reference to FIG. 1, the I/O level shifter 112 is configured to level-shift I/O signals transferred between the interface device 104 and the SIM card 108. The I/O level shifter 112 has an input/output A (I/O_A) terminal coupled to exchange I/O signals with the interface device 104 over an interface I/O line 116, and has an input/output B (I/O_B) terminal coupled to exchange I/O signals with the SIM card 108 over a SIM I/O line 120. The I/O level shifter 112 shifts the voltage of a signal transmitted by the interface device 104 from a first voltage level to a second voltage level and transfers the level-shifted signal to the SIM card 108. Likewise, the I/O level shifter 112 shifts the voltage of a signal transmitted by the SIM card 108 from the second voltage level to the first voltage level and transfers the level-shifted signal to the interface device 104. Since the interface device 104 may operate at a lower voltage level (e.g., 1.0V, 1.2V) than the SIM card 108 (e.g., 1.8V, 3.3V), the I/O level shifter 112 shifts the voltage level of the I/O signals to allow exchange of I/O signals between the interface device 104 and the SIM card 108.

In other embodiments, the interface device 104 may operate at a higher voltage level than the SIM card 108. In yet other embodiments, both the interface device 104 and the SIM card 108 may operate at the same voltage level. When both the interface device 104 and the SIM card 108 operate at the same voltage level, the SIM interface 100 functions as a buffer.

Figure 2:
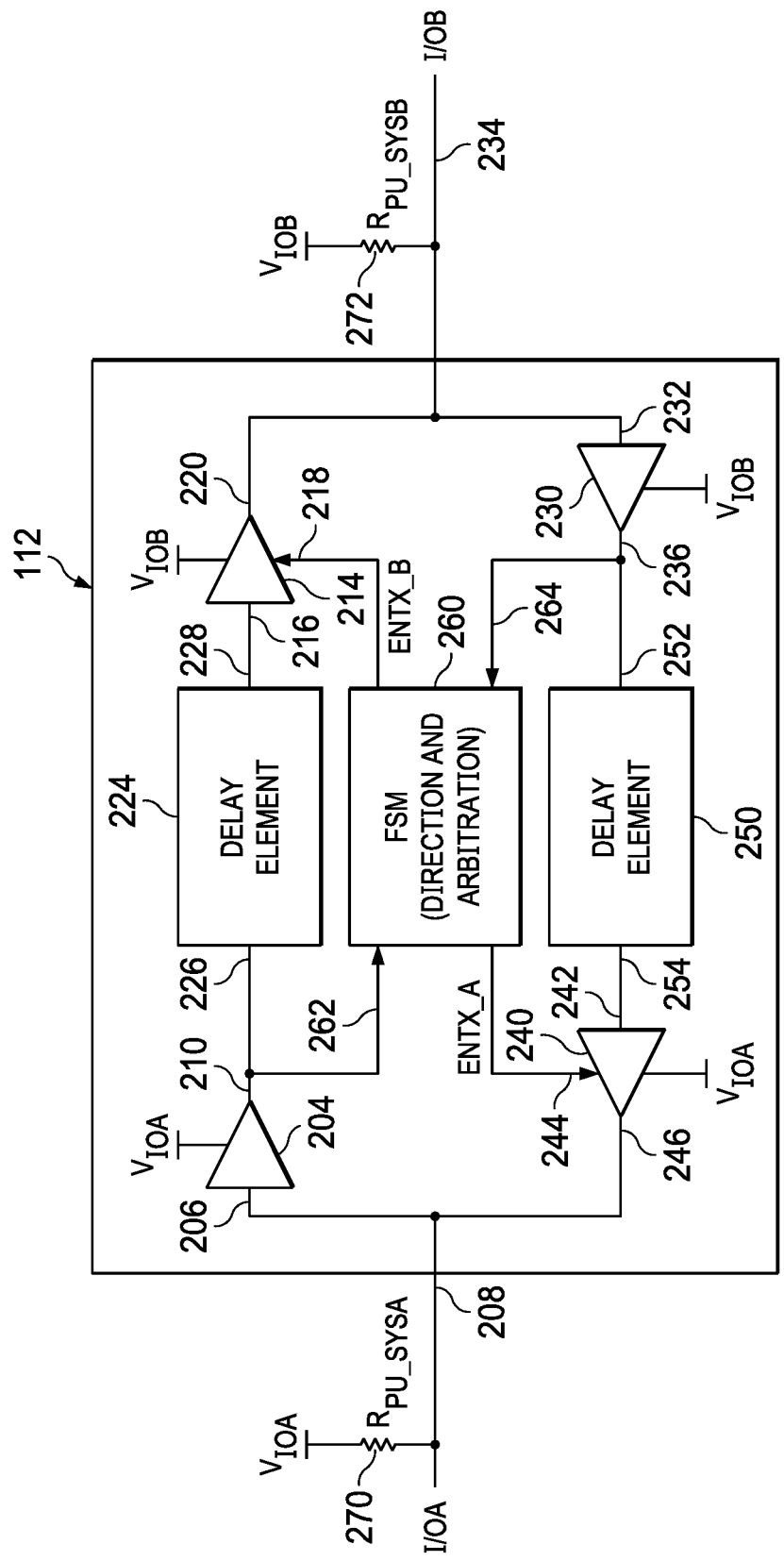
FIG. 2 illustrates an input/output (I/O) level shifter in accordance with an exemplary embodiment.

FIG. 2 illustrates the I/O level shifter 112 in accordance with an exemplary embodiment. The I/O level shifter 112 includes a first receiver 204 having a data input 206 coupled to an interface I/O line 208 and having a data output 210. The I/O level shifter 112 also includes a first transmitter 214 having a data input 216, a control input 218, and a data output 220. The data output 220 of the first transmitter 214 is coupled to a SIM input/output (I/O) line 234. A first delay element 224 is coupled between the first receiver 204 and the first transmitter 214. The first delay element 224 includes a data input 226 coupled to the data output 210 of the first receiver 204 and includes a data output 228 coupled to the data input 216 of the first transmitter 214. The first delay element 224 is configured to apply a predetermined time delay to data passing through the first delay element 224.

With continuing reference to FIG. 2, the I/O level shifter 112 includes a second receiver 230 having a data input 232 coupled to the SIM I/O line 234 and includes a data output 236. The I/O level shifter 112 also includes a second transmitter 240 having a data input 242, a control input 244, and a data output 246. The data output 246 of the second transmitter 240 is coupled to the interface I/O line 208. A second delay element 250 is coupled between the second receiver 230 and the second transmitter 240. The second delay element 250 includes a data input 252 coupled to the data output 236 of the second receiver 230 and includes a data output 254 coupled to the data input 242 of the second transmitter 240. The second delay element 250 applies a predetermined time delay to data passing through the second delay element 250. The I/O level shifter 112 is coupled to an interface device (shown in FIG. 1) via the interface I/O line 208 and is coupled to a SIM card (shown in FIG. 1) via the SIM I/O line 234.

With continuing reference to FIG. 2, the I/O level shifter 112 includes a controller 260 having a first input 262 coupled to the data output 210 of the first receiver 204 and having a second input 264 coupled to the data output 236 of the second receiver 230. The controller 260 is configured to apply a first enable signal to the control input 218 of the first transmitter 214 to turn ON the first transmitter 214 when the direction of packet is from the interface device to the SIM card. The controller 260 is configured to apply a second enable signal to the control input 244 of the second transmitter 240 to turn ON the second transmitter when the direction of packet is from the SIM card to the interface device. The controller 260 is configured to not apply the first and the second enable signals concurrently. Since bidirectional I/O signals between the I/O level shifter 112 and the interface device are transmitted over the same line, i.e., the interface I/O line 208, the controller 260 selectively controls the ON/OFF period of the transmitter 240 to maintain half-duplex communication on the interface I/O line 210 to prevent undesired positive data feedback. Likewise, the controller 260 selectively controls the ON/OFF period of the transmitter 214 to maintain half-duplex communication on the SIM I/O line 234 to prevent undesired positive data feedback.

With continuing reference to FIG. 2, a first pull-up resistor 270 coupled between a first voltage supply VIOA and the interface I/O line 208 holds the interface I/O line 208 at a HIGH state when there is no packet on the interface I/O line 208, i.e., when the interface I/O line 208 is idle. A second pull-up resistor 272 coupled between a second voltage supply VIOB and the SIM I/O line 234 holds the SIM I/O line 234 at a HIGH state when there is no packet on the SIM I/O line 234, i.e., when the SIM I/O line 234 is idle. Thus, when there is no packet on either the interface I/O line 208 or the SIM I/O line 234, both the interface I/O line 208 and the SIM I/O line 234 are held at a HIGH state by the pull-up resisters 270, 272.

In an exemplary embodiment, when the SIM card transmits packets to the interface device, the controller 260 turns ON the second transmitter 240 by applying the second enable signal but the first transmitter 214 is not turned ON. When the interface device transmits packets to the SIM card, the controller 260 turns ON the first transmitter 214 by applying the first enable signal but the second transmitter 240 is not turned ON. Thus, when the direction of packet flow is from the interface device to the SIM card, only the first transmitter 214 is turned ON, and when the direction of packet flow is from the SIM card to the interface device, only the second transmitter 240 is turned ON. By selectively turning ON either the first transmitter 214 or the second transmitter 240, the controller 260 maintains half-duplex communication on the interface I/O line 208 and the SIM I/O line 234, thereby preventing undesired positive data feedback. The controller 260 does not concurrently turn ON both the first and second transmitters 214, 240.

In an exemplary embodiment, if a HIGH to LOW transition occurs on the interface I/O line 208 before a HIGH to LOW transition occurs on the SIM I/O line 234, the controller 260 determines that the direction of packet flow is from the interface device to the SIM card. Accordingly, the controller 260 applies the first enable signal to turn ON the first transmitter 214 but the transmitter 240 remains disabled. On the other hand, if a HIGH to LOW transition occurs on the SIM I/O line 234 before a HIGH to LOW transition occurs on the interface I/O line 208, the controller 260 determines that the direction of packet flow is from the SIM card to the interface device. Accordingly, the controller 260 applies the second enable signal to turn ON the second transmitter 240 but the first transmitter 214 remains disabled. If a HIGH to LOW transition does not occur on either the interface I/O line 208 or the SIM I/O line 234, the controller 260 determines that the interface I/O line 208 and the SIM I/O line 234 are both idle, and accordingly the controller 260 does not turn ON any transmitter.

Consider, for example, an interface device is connected to a SIM card via the I/O level shifter 112. Upon power on, the interface I/O line 208 and the SIM I/O line 234 are both idle. The interface I/O line 208 and the SIM I/O line 234 may be defined as being idle when they are both at a HIGH state for a predetermined time period. Next, the controller 260 detects a HIGH to LOW transition has occured on the interface I/O line 208 before a HIGH to LOW transition has occurred on the SIM I/O line 234. Accordingly, the controller 260 determines that the direction of packet flow is from the interface device to the SIM card and applies the first enable signal to turn ON the first transmitter 214. The packet transmitted by the interface device over the interface I/O line 208 is received by the receiver 204 and then is passed through the first delay element 224. The first delay element 224 delays the packet to allow the direction detection to be completed, the first transmitter 214 to be enabled, and the opposite path to be disabled by not turning ON the second transmitter 240 to prevent undesired positive feedback.

If the controller detects that a HIGH to LOW transition has occurred on the SIM I/O line 234 before a HIGH to LOW transition has occurred on the interface I/O line 208, the controller 260 determines that the direction of packet flow is from the SIM card to the interface device and applies the second enable signal to turn ON the second transmitter 240 but the first transmitter 214 remains disabled. The packet transmitted by the SIM card over the SIM I/O line 234 is received by the receiver 230 and is then passed through the second delay element 250. The second delay element 250 delays the packet to allow the direction detection to be completed, the second transmitter 240 to be enabled, and the opposite path to be disabled by not turning ON the first transmitter 214 to prevent undesired positive feedback.

In an exemplary embodiment, responsive to a LOW to HIGH transition of the SIM I/O line 234 indicating the end of packets, the controller 260 applies a first disable signal to the control input 218 of the first transmitter 214 to turn OFF the first transmitter 214. In other embodiments, the controller 260 applies the first disable signal to the control input 218 after the SIM I/O line remains HIGH for a predetermined time period after the LOW to HIGH transition. Similarly, responsive to a LOW to HIGH transition of the interface I/O line 208 indicating the end of packets, the controller 260 applies a second disable signal to the control input 244 of the second transmitter 240 to turn OFF the second transmitter 240. In other embodiments, the controller 260 applies the second disable signal to the control input 244 after the interface I/O line 208 remains HIGH for a predetermined time period after the LOW to HIGH transition.

In an exemplary embodiment, when the interface I/O line 208 and the SIM I/O line 234 are both idle, the controller applies the first and second disable signals concurrently to disable both the first transmitter 214 and the second transmitter 240. The first and second receivers 204, 230, are not disabled.

In an exemplary embodiment, the first transmitter and the second receiver are coupled to the first voltage supply VIOA, while the first receiver and the second transmitter are coupled to a second voltage supply VIOB. If the first voltage supply VIOA is 1.0V and the second voltage VIOB supply is 1.8V, I/O signals flowing from the peripheral device to the SIM card is level-shifted up from 1.0V to 1.8V while I/O signals flowing from the SIM card to the peripheral device is level-shifted down from 1.8V to 1.0V. Thus, appropriate level shifting is provided by selecting the voltage levels of the first and the second voltage supply. In other embodiments, the first voltage supply can be higher than the second voltage supply, and in yet other embodiments, the first voltage supply can be at the same level as the second voltage supply.

Variations to the controller 260 are possible within the scope of the disclosure. For example, the controller 260 may be realized with a finite state machine (FSM) defined by an initial state (i.e., both I/O lines in IDLE state) and conditions for each transition. Responsive to the direction of packet flow, the finite state machine selectively enables one of the two transmitters and holds the other transmitter in a disabled state. The FSM may be built in hardware or software. Alternatively, the controller 260 may be realized by a general purpose processor.

In an exemplary embodiment, the first receiver 204, the first transmitter 214, the second receiver 230 and the second transmitter 240 are realized with buffers. By coupling the buffers to voltage supplies with varying voltage levels, appropriate voltage level-shifting can be provided. The first and second delay elements 224, 250 can also be realized with one or more buffers. The HIGH to LOW transition of the interface I/O line 208 can be detected when the output of a buffer (first receiver 204) transitions to LOW, and the LOW to HIGH transition of the interface line I/O line 208 can be detected when the output of the buffer (first receiver 204) transitions to HIGH. Similarly, the transitions of the SIM I/O line 234 can be detected from the output of a buffer (second receiver 230).

Figure 3:
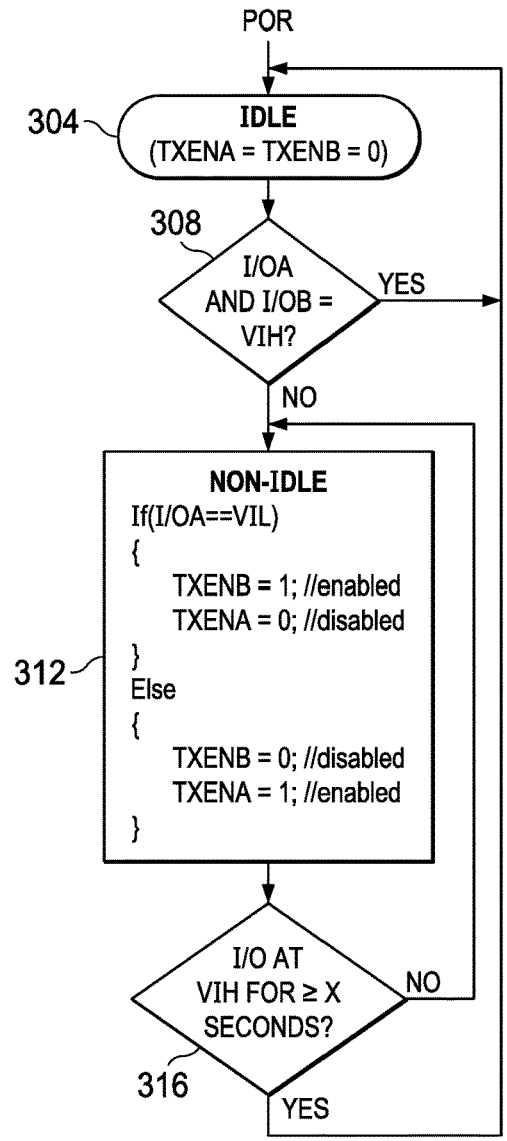
FIG. 3 is a state diagram illustrating transitions by a finite state machine configured to control the I/O level shifter.

FIG. 3 is an exemplary state diagram illustrating transitions by a FSM configured to control the operation of the I/O level shifter 112. In a state 304, initially both the interface I/O line 208 and the SIM I/O line 234 are in a HIGH state (i.e., idle). Thus, the first and second enable signals are not applied by the FSM. Next, the FSM transitions to a state 308 where the interface I/O line 208 and the SIM I/O line are monitored to determine if there is any packet on either of the two lines. In the state 308, a logic AND operation between the interface I/O line and the SIM I/O line can be performed to check if both the interface I/O line 208 and the SIM I/O line are HIGH. If the logic AND operation finds both the interface I/O line 208 and the SIM I/O line 234 are HIGH, the FSM determines there are no packets on either of the I/O lines 208, 234, and the FSM returns to the state 304. If the logic AND finds that either the interface I/O line 208 and the SIM I/O line are not HIGH, the FSM determines there are packets on at least one of the two I/O lines. The FSM transitions to a state 312 where the direction of traffic is determined. If the interface I/O line 208 is LOW, the FSM determines the direction of packets is from the interface device to the SIM card. Accordingly, the FSM turns ON the first transmitter 214 by applying the first enable signal; otherwise, the FSM turns ON the second transmitter 240 by applying the second enable signal.

Consider, as an example, the FSM turns ON the first transmitter 214. After conclusion of data transmission by the first transmitter 214, the interface I/O line 208 becomes idle and thus returns to a HIGH state. The FSM then transitions to a state 316 where a determination is made if the interface I/O line 208 has remained in a HIGH state for a minimum threshold period. If the interface I/O line 208 has remained in a HIGH state for a minimum threshold period, the FSM returns to the state 304; otherwise, the FSM returns to the state 312.

Various illustrative components, blocks, modules, circuits, and steps have been described above in general terms of their functionality. Whether such functionality is implemented as hardware or software depends upon the particular application and design constraints imposed on the overall system. The described functionality may be implemented in varying ways for each particular application, but such implementation decision should not be interpreted as causing a departure from the scope of the present disclosure.

For simplicity and clarity, the full structure and operation of all systems suitable for use with the present disclosure is not being depicted or described herein. Instead, only so much of a system as is unique to the present disclosure or necessary for an understanding of the present disclosure is depicted and described.

What is claimed is:

1. An input/output (I/O) level shifter for a subscriber identification module (SIM) interface, comprising:
a first receiver having a data input coupled to an interface input/output (I/O) line and having a data output;
a first transmitter having a data input, a control input, and a data output;
a first delay element coupled between the first receiver and the first transmitter, the first delay element having a data input coupled to the data output of the first receiver and having a data output coupled to the data input of the first transmitter;
a second receiver having a data input coupled to a SIM input/output (I/O) line and having a data output;
a second transmitter having a data input, a control input, and a data output coupled to the interface I/O line;
a second delay element coupled between the second receiver and the second transmitter, the second delay element having a data input coupled to the data output of the second receiver and having a data output coupled to the data input of the second transmitter; and
a controller having a first input coupled to the data output of the first receiver and having a second input coupled to the data output of the second receiver,
wherein the controller is configured to apply a first enable signal to the control input of the first transmitter to turn ON the first transmitter when the direction of packet flow is from an interface device to a SIM card, and wherein the controller is configured to apply a second enable signal to the control input of the second transmitter to turn ON the second transmitter when the direction of packet flow is from the SIM card to the interface device, and wherein the controller is configured to not apply the first and the second enable signals concurrently.

2. The I/O level shifter of claim 1, wherein the direction of packet flow is from the interface device to the SIM card when a HIGH to LOW transition of the interface I/O line occurs prior to a HIGH to LOW transition of the SIM I/O line.

3. The I/O level shifter of claim 1, wherein the direction of packet flow is from the SIM card to the interface device when a HIGH to LOW transition of the SIM I/O line occurs prior to a HIGH to LOW transition of the interface I/O line.

4. The I/O level shifter of claim 1, wherein the controller is configured to apply a first disable signal to the control input of the first transmitter responsive to a LOW to HIGH transition of the interface I/O line, and wherein the controller is configured to apply a second disable signal to the control input of the second transmitter responsive to a LOW to HIGH transition of the SIM I/O line.

5. The I/O level shifter of claim 1, wherein the controller is configured to apply the first and second disable signals concurrently when the interface I/O line and the SIM I/O line are both idle.

6. The I/O level shifter of claim 1, wherein the first receiver is coupled to a first voltage supply and the first transmitter is coupled to a second voltage supply.

7. The I/O level shifter of claim 1, wherein the second receiver is coupled to a second voltage supply and the second transmitter is coupled to a first voltage supply.

8. The I/O level shifter of claim 1, wherein the I/O level shifter is configured to convert an interface I/O signal from the interface I/O line having a first voltage level to a SIM I/O signal having a second voltage level.

9. The I/O level shifter of claim 1, wherein the I/O level shifter is configured to convert a SIM I/O signal from the SIM I/O line having a second voltage level to an interface I/O signal having a first voltage level.

10. The I/O level shifter of claim 1, wherein packets are exchanged between the SIM interface and an interface device over a peripheral I/O line.

11. The I/O level shifter of claim 1, wherein packets are exchanged between the SIM interface and a SIM card over the SIM I/O line.

12. The I/O level shifter of claim 1, wherein the controller is a finite state machine.

13. An input/output (I/O) level shifter for a subscriber identification module (SIM) interface, comprising:
- a first receiver having a data input coupled to an interface input/output (I/O) line and having a data output;
- a first transmitter having a data input, a control input, and a data output coupled to a SIM input/output (I/O) line;
- a first delay element coupled between the first receiver and the first transmitter, the first delay element having a data input coupled to the data output of the first receiver and having a data output coupled to the data input of the first transmitter;
- a second receiver having a data input coupled to the SIM I/O line and having a data output;
- a second transmitter having a data input, a control input, and a data output coupled to the interface I/O line;
- a second delay element coupled between the second receiver and the second transmitter, the second delay element having a data input coupled to the data output of the second transmitter and having a data output coupled to the data input of the second transmitter; and
- a controller having a first input coupled to the data output of the first receiver and having a second input coupled to the data output of the second receiver, wherein the controller is configured to apply a first enable signal to the control input of the first transmitter responsive to a HIGH to LOW transition of the interface I/O line, and wherein the controller is configured to apply a second enable signal to the control input of the second transmitter responsive to a HIGH to LOW transition of the SIM I/O line.

14. The I/O level shifter of claim 13, wherein the controller is configured to apply the first enable signal to the control input of the first transmitter when the HIGH to LOW transition of the interface I/O line occurs prior to the HIGH to LOW transition of the SIM I/O line.

15. The I/O level shifter of claim 13, wherein the controller is configured to apply the second enable signal to the control input of the second transmitter when the HIGH to LOW transition of the SIM I/O line occurs prior to the HIGH to LOW transition of the interface I/O line.

16. The I/O level shifter of claim 13, wherein the controller is configured to apply a first disable signal to the control input of the first transmitter responsive to a LOW to HIGH transition of the interface I/O line, and wherein the controller is configured to apply a second disable signal to the control input of the second transmitter responsive to a LOW to HIGH transition of the SIM I/O line.

17. The I/O level shifter of claim 13, wherein the controller is configured to apply the first enable signal to turn ON the first transmitter responsive to a HIGH to LOW transition of the interface I/O line, and wherein the controller is configured to apply the second enable signal to the turn ON the second transmitter responsive to a HIGH to LOW transition of the SIM I/O line.

18. The I/O level shifter of claim 13, wherein the controller is configured to apply the first disable signal to turn OFF the first transmitter responsive to a LOW to HIGH transition of the interface I/O line, and wherein the controller is configured to apply the second disable signal to turn OFF the second transmitter responsive to a LOW to HIGH transition of the SIM I/O line.

19. The I/O level shifter of claim 13, wherein the controller is configured to apply the first and second disable signals concurrently when the interface I/O line and the SIM I/O line are both idle.

20. The I/O level shifter of claim 13, wherein the controller is configured to not apply the first and the second enable signals concurrently.

21. The I/O level shifter of claim 13, wherein the first receiver is coupled to a first voltage supply and the first transmitter is coupled to a second power supply.

22. The I/O level shifter of claim 13, wherein the second receiver is coupled to a second voltage supply and the second transmitter is coupled to a first voltage supply.

23. The I/O level shifter of claim 13, wherein the I/O level shifter is configured to convert an interface I/O signal from the interface I/O line having a first voltage level to a SIM I/O signal having a second voltage level.

24. The I/O level shifter of claim 13, wherein the I/O level shifter is configured to convert a SIM I/O signal from the SIM I/O line having a second voltage level to an interface I/O signal having a first voltage level.

25. The I/O level shifter of claim 13, wherein packets are exchanged between the SIM interface and an interface device over the interface I/O line.

26. The I/O level shifter of claim 13, wherein packets are exchanged between the SIM interface and a SIM card over the SIM I/O line.

27. The I/O level shifter of claim 13, wherein the controller is a finite state machine.

28. An input/output (I/O) level shifter for a subscriber identification module (SIM) interface, comprising:
- a first receiver having a data input coupled to an interface input/output (I/O) line and having a data output;
- a first transmitter having a data input, a control input and a data output coupled to a SIM input/output (I/O) line;
- a first delay element coupled between the first receiver and the first transmitter, the first delay element having a data input coupled to the data output of the first receiver and having a data output coupled to the data input of the first transmitter;
- a second receiver having a data input coupled to the SIM I/O line and having a data output;
- a second transmitter having a data input, a control input, and a data output coupled to the interface I/O line;
- a second delay element coupled between the second receiver and the second transmitter, the second delay element having a data input coupled to the data output of the second receiver and having a data output coupled to the data input of the second transmitter; and a controller having a first input coupled to the data output of the first receiver and having a second input coupled to the data output of the second receiver, wherein the controller is configured to apply a first enable signal to the control input of the first transmitter to turn ON the first transmitter when a HIGH to LOW transition of the interface I/O line occurs prior to a HIGH to LOW transition of the SIM I/O line, and wherein the controller is configured to apply a second enable signal to the control input of the second transmitter when a HIGH to LOW transition of the SIM I/O line occurs prior to a HIGH to LOW transition of the interface I/O line, and wherein the controller is configured to not apply both the first and second enable signals concurrently.

29. The I/O level shifter of claim 28, wherein the controller is configured to apply a first disable signal to the control input of the first transmitter to turn OFF the first transmitter responsive to a LOW to HIGH transition of the interface I/O line, and wherein the controller is configured to apply a second disable signal to the control input of the second transmitter to turn OFF the second transmitter responsive to a LOW to HIGH transition of the SIM I/O line.

30. The I/O level shifter of claim 28, wherein the controller is configured to apply the first enable signal to turn ON the first transmitter responsive to a HIGH to LOW transition of the peripheral I/O line only if the second transmitter is turned OFF.

31. The I/O level shifter of claim 28, wherein the controller is configured to apply the second enable signal to turn ON the second transmitter responsive to a HIGH to LOW transition of the SIM I/O line only if the first transmitter is turned OFF.

32. The I/O level shifter of claim 28, wherein the controller is configured to apply the first and second disable signals concurrently when the interface I/O line and the SIM I/O line are both are idle.

33. The I/O level shifter of claim 28, wherein packets are exchanged between the SIM interface and an interface device over the interface I/O line.

34. The I/O level shifter of claim 28, wherein packets are exchanged between the SIM interface and a SIM card over the SIM I/O line.

35. The I/O level shifter of claim 28, wherein the controller is a finite state machine.

* * * * *